(12) United States Patent
Barkan

(10) Patent No.: US 6,397,364 B1
(45) Date of Patent: *May 28, 2002

(54) DIGITAL DATA REPRESENTATION FOR MULTI-BIT DATA STORAGE AND TRANSMISSION

(76) Inventor: Mordecai Barkan, 304 Calcaterra Pl., Palo Alto, CA (US) 94306

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/189,244

(22) Filed: Nov. 10, 1998

Related U.S. Application Data

(60) Provisional application No. 60/082,458, filed on Apr. 20, 1998.

(51) Int. Cl.[7] ............................................... G06F 11/00
(52) U.S. Cl. ........................................ 714/746; 714/752
(58) Field of Search .................................. 714/714, 761, 714/763, 746, 769–771

(56) References Cited

U.S. PATENT DOCUMENTS

| | | | | |
|---|---|---|---|---|
| 4,206,440 A | * | 6/1980 | Doi et al. ................ | 714/761 |
| 4,415,767 A | | 11/1983 | Gill et al. ................ | 381/45 |
| 4,539,683 A | * | 9/1985 | Hahn et al. ............... | 714/714 |
| 4,694,456 A | * | 9/1987 | Morita et al. ............. | 714/763 |
| 4,849,833 A | | 7/1989 | Yoshimura et al. ......... | 360/36.2 |
| 6,078,693 A | | 6/2000 | Kawanura et al. .......... | 382/238 |
| 6,081,398 A | | 6/2000 | Ozue ...................... | 360/64 |

* cited by examiner

*Primary Examiner*—Phung M. Chung
*Assistant Examiner*—Emeka J. Amanze

(57) ABSTRACT

The present invention provides for storage and transmission of digital data by analog media, discrete and continuous, and more particularly to digital data representation for multi-bit data storage and transmission, using means to trade Ns (media noise) with Np (process contributed noise), thus allowing for storage of more bits per memory cell or increase capacity of transmission channel when compared to the amounts attainable by common practice. The storage media may be of any analog type, such as FLASH, RAM (D or S), EPROMS of various types and even used with continuous analog data storage or transmission.

11 Claims, 7 Drawing Sheets

DIGITAL DATA REPRESENTATION FOR MULTI-BIT DATA STORAGE AND TRANSMISSION

CROSS REFERENCE TO RELATED APPLICATIONS

The present application is related to provisional patent application Ser. No. 60/082,458, filed Apr. 20, 1998 entitled "Digital Data Representation for Multi-Bit Storage And Transmission", and the benefit of the earlier Apr. 20, 1998 filing date is claimed for the present application in accordance with 35 U.S.C. §119 (e)(1).

BACKGROUND OF THE INVENTION

The present invention relates to storage and transmission of digital data by analog media, discrete and continuous, and more particularly to digital data representation for multi-bit data storage and transmission.

One common practice for transmission of binary data is by means of bit representation as sequences of binary streams. See, for example, Spread Spectrum Systems, 2nd edition, 1984 by Robert C. Dixon.

The coding technique described in that reference is used by various transmission systems to overcome issues of interference, such as inter-symbol, channel jamming and other. One typical advantage to the use of PRN (Pseudo Random Noise) sequences is the ability of several users sharing the same frequency in the same time.

This coding technique is not used with multi-bit signals, where a sequence represents several bits (a word). Many applications may benefit from the representation of multi-bit (word) with a sequence and the use of multiple sequences in the same media, transmission channel or storage cells, to represent a block of data.

SUMMARY OF THE INVENTION

It is an object of the present invention to provide for storage and transmission of digital data by analog media, discrete and continuous, and more particularly to digital data representation for multi-bit data storage and transmission. A storage memory according to the present invention for storing digital data includes digital signal processing (DSP) means for transforming a digital data bit stream having a stored data component so as to provide improved storage capacity; means for converting the transformed digital data to form analog data; and discrete analog memory means for storing the analog data.

The drive for the present invention is the development of means to trade Ns (media noise) with Np (process contributed noise), thus allowing for storage of more bits per memory cell or increase capacity of transmission channel when compared to the amounts attainable by common practice. The storage media may be of any analog type, such as FLASH, RAM (D or S), EPROMS of various types and even used with continuous analog data storage or transmission. Analog storage or transmission is referred here as the general case that embodies the multi bit case.

The present invention takes advantage of coding the data for storage by means of "orthogonal" vectors (see Dictionary of Science & Technology, by Wordsworth Editions Ltd, 1995, ISBN 1-85326-351-6, page 634), similar to the use of such means in communications. Actually, every implementation used in communications system to improve Signal-to-Noise-Ratio of discrete data sequences, might be applicable for discrete analog storage.

By transforming or coding the digital data prior to storage and store the transformed data as analog data, results an improvement in total S/N (Signal to Noise ratio), allowing for better utilization of the analog media (storage or transmission) when compared with the implementation of conventional approaches. In the case of discrete analog memory, the better utilization is measured by the average amount of bits of data stored in each memory cell.

The present invention may be implemented by using various means of data transformation. It is important to distinguish between this step and ECC (Error Control Coding) means which are allowing for the recovery of signals/data in noise, without the improvement of S/N. Means of ECC are applicable here as complementary means to cope with errors in the digital data after the inverse transformation or decoding.

The process has two main steps:
1. Error Control Coding.
2. Coding/Decoding of the resulting bit/word stream.

The ECC (Error Control Coding) needs to be properly implemented with the new processing. The application of this means may be carried out by conventional means, but new techniques will take advantage of the a priori known decoded data.

After applying ECC and adding the required bits/data, the resulting bit/data streams are organized in blocks of n words each, with m bits in each word. Contrary to conventional implementation that stores these words to n discrete analog cells, the present invention provides that these n data values will be coded to form a new block of n' words with m' bits each. The resulting block of data is stored in n' discrete analog memory cells. The selection of the coding, n, m, n' and m' is made in such way to improve S/Ns (Signal to Storage Noise ratio) while maintaining low processing noise (Np), where Ns is the noise generated by the storage media and is added (or multiplied) to the analog values during the read process. Ns is a function of various arguments such as: process, technology, temperature, time, radiation—usually given as probability distribution function.

The coding techniques may vary in many ways and may use known sequences. The selection of the Coding (and n, m, n' and m') is done to allow the addition of processing noise (Np) to storage noise (Ns), in controlled manner, thus the total noise levels after the processing will be below the storage noise (Ns). Other considerations are issues related to the required BER (Bit Error Rate) and ECC.

Since the exact contribution of the processing noise may be computed before the actual storage of the data, by means of decoding prior to the actual storage, further improvement may be gained by optimizing the ECC (Error Control Coding) means, and minimize the overhead contributed by the ECC to achieve a certain BER (Bit Error Rate).

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 12 shows use of two storage sections in same memory according to the present invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
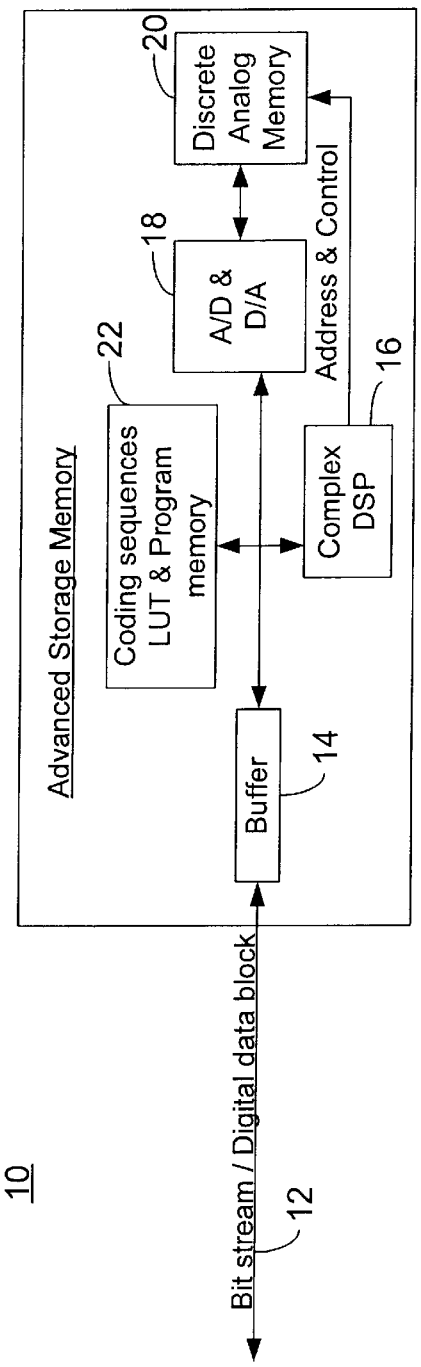
FIG. 1 shows general outline of a system for implementing multi bit storage, utilizing DSP (Digital Signal Processing) algorithms according to the present invention.

FIG. 1 shows the main components of a typical storage system 10 designed for storage of digital data by means of a discrete analog memory according to the present invention. The digital data may be delivered to the storage system 10, via a digital input 12, in various ways, such as a bit stream or over a bus, and is accumulated in a temporary memory, the buffer unit 14. Once a block of data, n words-m bits, is available for processing, the DSP (Digital Signal Processor) 16 (which represents either a simple logic circuit or a complex processor) processes the block of data and generates a new block of data with n' words-m' bits each. The block of data is then converted by means of an A/D 18 to analog values to be stored in the storage media (discrete memory cells) 20. The DSP 16 carries out the computation in accordance with the program to result in the desired coding, and may utilize in the process various means, such as LUT (Look Up Tables) 22. Once the transformation is done, the n' data values are rounded to m' bits, and by means of a m' bits D/A 18, converted to analog values and stored in this form to the discrete memory cells 20. When the stored data is needed, the analog values are read from the memory cells 20 by means of a m" bits A/D 18 , and a block of n' words-m" bits is stored to the buffer 14. When the n' words are available for processing, the DSP 16 is computing the inverse transformation. The resulting block of n data words are translated to an m bits each. Although the ECC (Error Correction Control) is not detailed, it is worth noting that the DSP 16 may be used for the computation required for this process, as would be understood by one of ordinary skill in the art.

Figure 2:
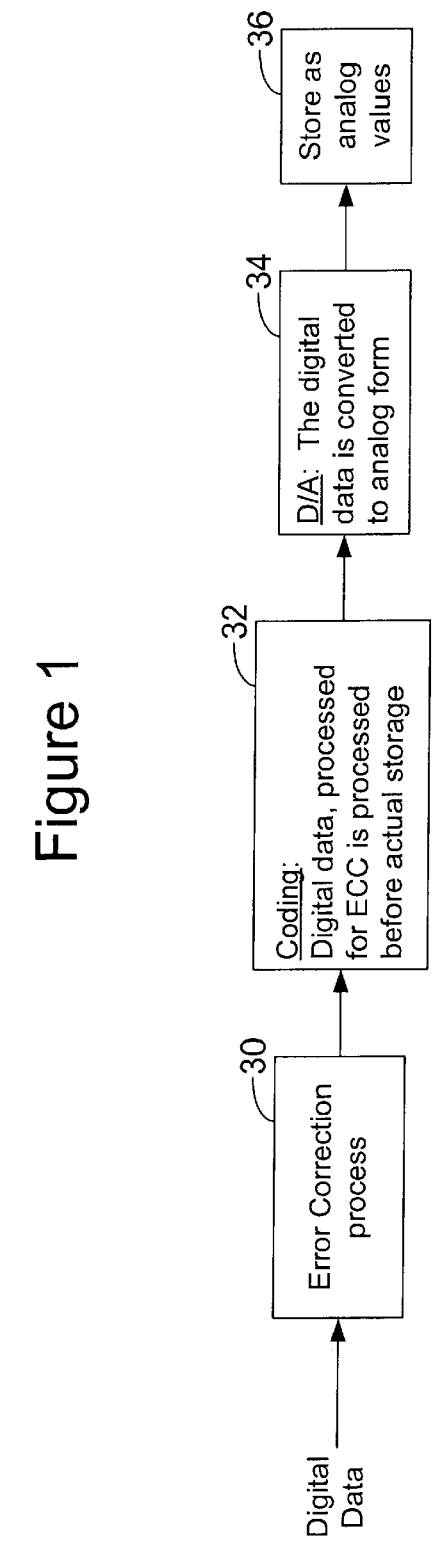
FIG. 2 shows the complete write process according to the present invention.

FIG. 2 shows a complete write or storage process according to the present invention. The digital data to be stored is first processed for error detection and correction at stage 30, followed by coding at stage 32 to improve S/N ratios in the reading/retrieval process. The digital data, processed for ECC is processed at stage 32 before actual storage. The resulting data is converted at stage 34 to analog form by means of a D/A (Digital to Analog) converter to an analog value to be stored at stage 36 in the Discrete Analog Storage 20 of FIG. 1.

Figure 3:
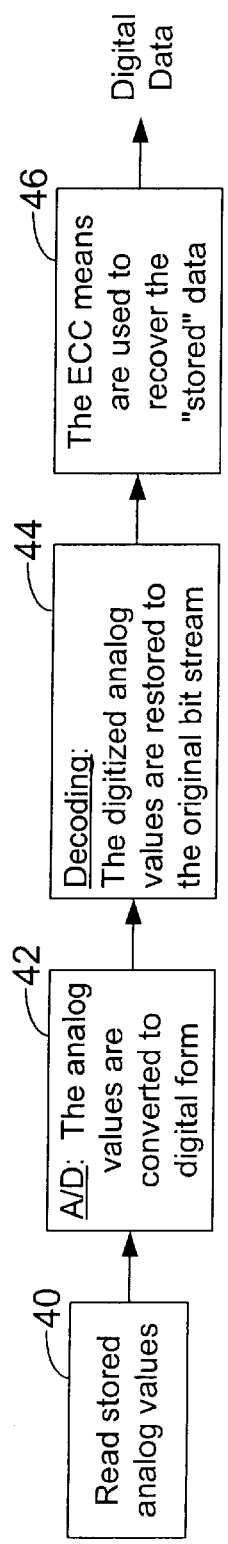
FIG. 3 shows the complete read process according to the present invention.

The complete read or retrieval process steps are shown in FIG. 3. The analog values are read at stage 40 from the storage media 20 and then converted to a digital form or representation at stage 42 by means of the A/D (Analog to Digital) converter. At stage 44, the digital data is then inverse transformed (the digitized analog values are restored to the original bit stream) into data that is further checked for errors and corrected, if found, at stage 46.

Figure 4:
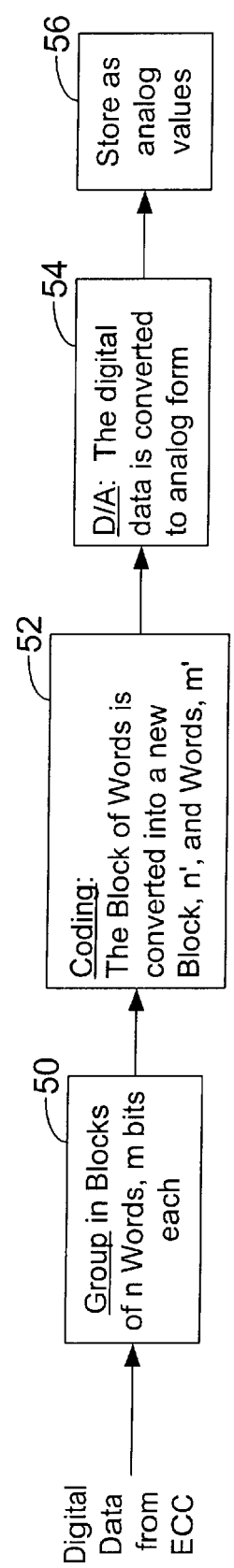
FIG. 4 shows the transformation/encoding process according to the present invention.

FIG. 4 shows in more detail the encoding process according to the present invention, which is the storage of digital data after the ECC process. At stage 50, the digital data is grouped in n words with m bits each. At stage 52, the resulting block of data is then processed and coded into a new block of n' words with m' bits each. At stage 54, by means of m' bits D/A converter, the digital data is converted to an analog value to be stored as analog values at stage 56.

Figure 5:
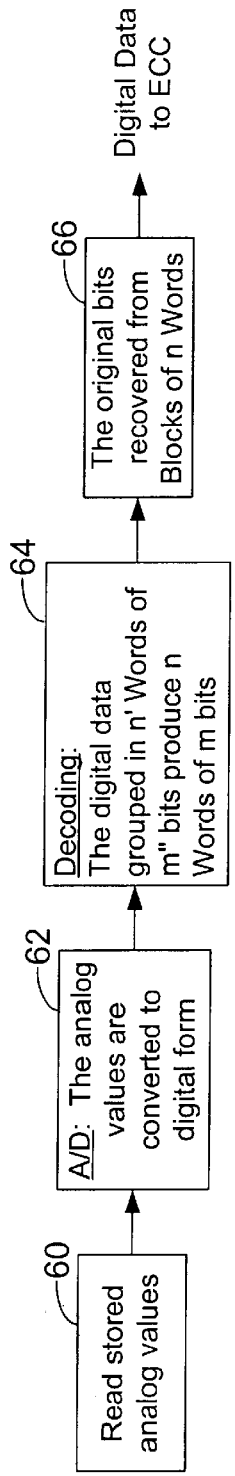
FIG. 5 shows the inverse-transformation/decoding process according to the present invention.

FIG. 5 shows the details of the decoding or read process according to the present invention. At stage 60, the analog data values are read from the analog storage. At stage 62, the analog values are converted to digital form by means of an m" bits A/D into m" bits words. At stage 64, the digital data are then grouped into blocks of n' words of m" bits. At stages 64,66, the n' words blocks of data are inverse transformed, and the inverse transformed values are further processed to generate the original n words of m bits each. Since all the process is carried in a "noisy" environment, and errors might be introduced, the block of n words is transferred to the ECC unit for error detection and correction.

Figure 6:
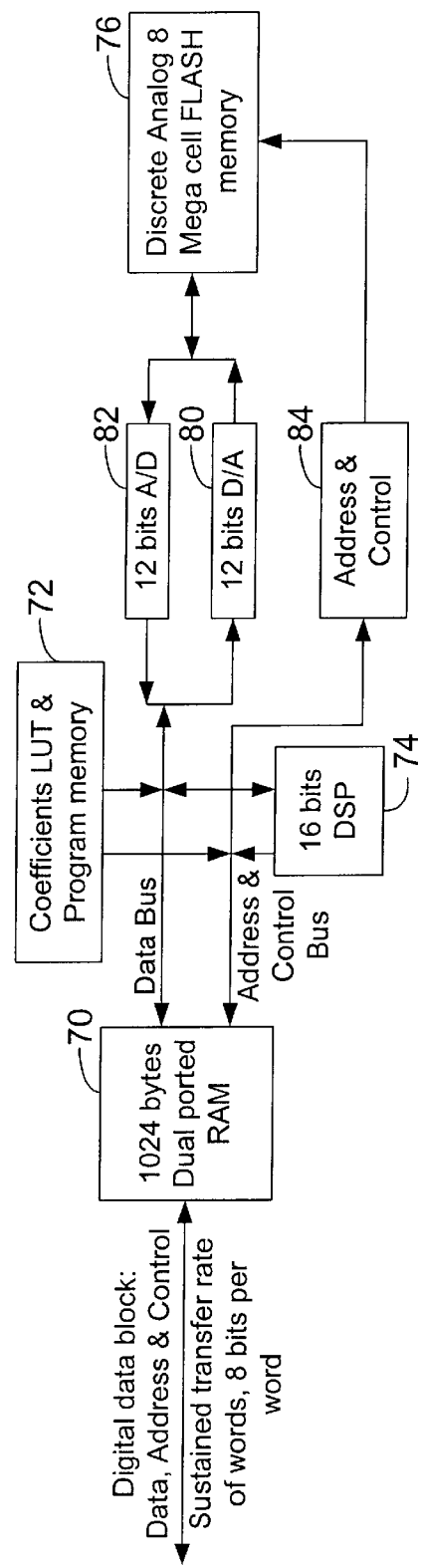
FIG. 6 shows a 5 bit storage per cell implementation example according to the present invention.

FIG. 6 shows a preferred embodiment of an Advanced Storage Memory using the present invention (it should be understood that one of ordinary skill in the art could modify the components and the algorithms of the present invention to fit various implementations). In FIG. 6, the data to be stored is transferred from the main system to a temporary buffer 70, a 1024 bytes Dual Ported RAM, which allows simultaneous access to the memory from the Advanced Storage Memory and the main system. A non volatile memory 72 contains the DSP program memory and sequences used in the coding and ECC process. The DSP 74 is fulfilling the tasks of the ECC and coding described in previous sections and detailed hereafter. The data is stored in the Discrete Analog FLASH memory 76. The interface to the DSP 74 is via a 12 bits D/A 80 and 12 bits A/D 82. The control and addressing 84 of the analog memory 76 is made by the DSP 74. The A/D for the retrieval process might be of higher value to improve noise/error immunity.

Figure 7:
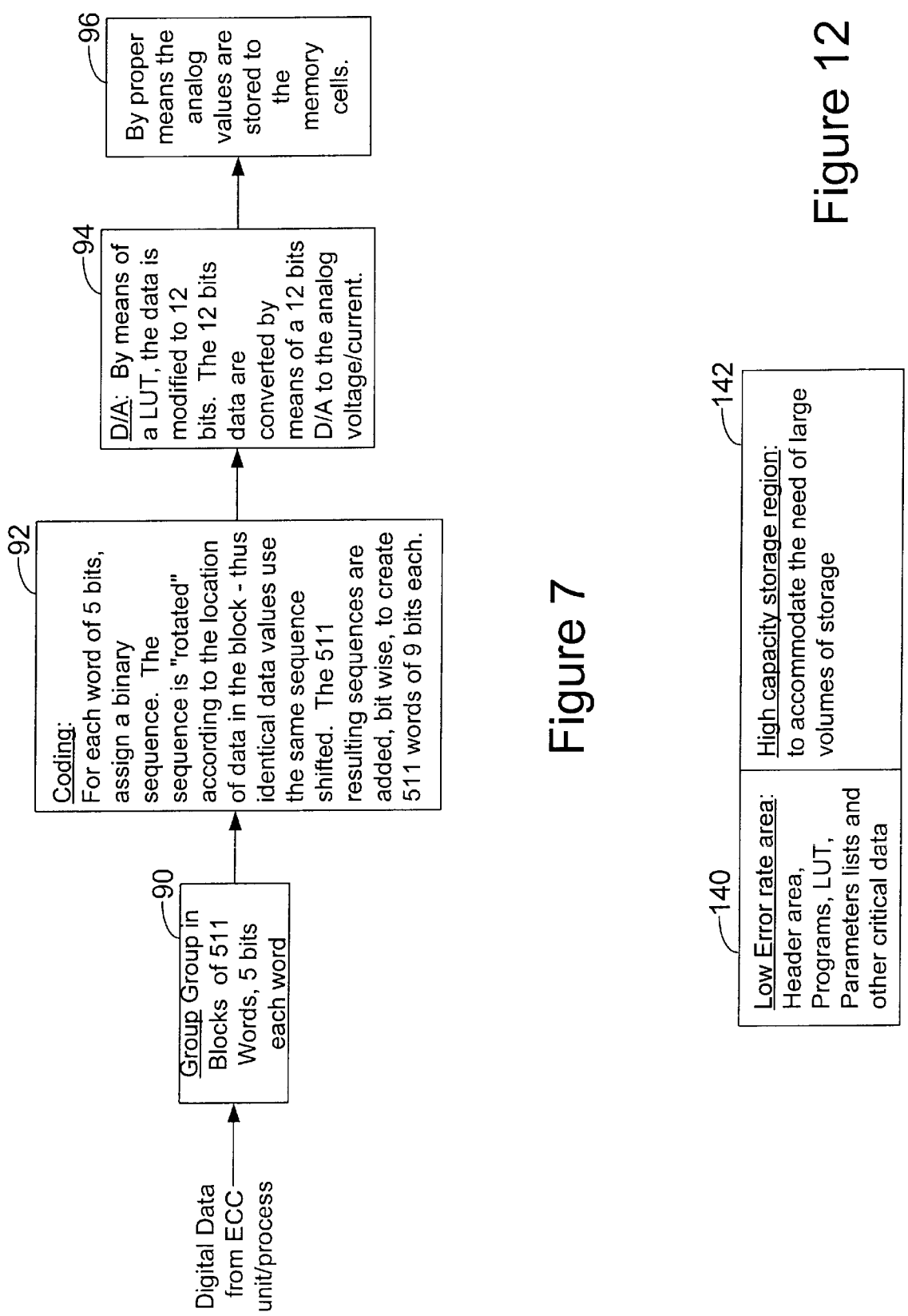
FIG. 7 shows a 5 bit storage write example according to the present invention.

FIG. 7 shows details of a 5-bit write process embodiment according to the present invention (the ECC, although carried out by the DSP, is not described here). In FIG. 7, the digital data, after going through the ECC process, is grouped at stage 90 in blocks of 511 words of 5 bits each. Based on PN coding technology (mentioned earlier), 511 long binary sequences are computed by means of a LFSR (Linear Feedback Shift Register) or selected from a pre computed LUT (Look Up Table). An example for generating 32 sequences, which is required when coding 5 bits,is provided in the reference, Spread Spectrum Systems, 2nd addition, 1984, by Robert C. Dixon. Of particular interest is the table 3.3 on page 67, which specifies the existence of 48 Maximal length sequences for 9 bits long Shift Register. To code the 5 bits only 32 sequences out of the 48 are required. The 32 sequences that provide the best signal to noise ratio during the retrieval process, are selected (or computed in real time). At stage 92. For each data in the block of 511 words, a specific sequence is selected based on its value and according to its location in the block the sequence is "rotated" (or "phase shifted") to provide the unique matching of sequence to each data value of 5 bits. The "phase difference" between the sequences used for coding the same data values will allow their proper retrieval during the read process, by maximizing the cross correlation functions in the specific locations. The amount of "rotation" equals the location of the value in the 511 block. Since 511 bits long sequences are utilized, the vector allows for unique matching of each value of 5 bits in the original 511 block. To avoid data recovery loss for extreme cases in which a block of identical values will result coded block with more then one decoding options, a different set of 32 sequences, out of the 48 available, is selected for each location/sample. The 511 resulting binary sequences, one for each of the 5 bits values, are added bit wise, to result a 511 block of data with 9 bits words each.

At stage 94, prior to storing a 9 bits value in the memory cell, the data are modified by means of a LUT (or other functional means), to a 12 bits value (or more) to optimize the actual analog values stored to the FLASH memory to take advantage of the retention mechanism of the memory (as later depicted and explained in FIGS. 10 and 11). The resulting 511 values are then converted by means of the 12 bits D/A to analog values to be stored to the Discrete Analog FLASH at stage 96.

Figure 8:
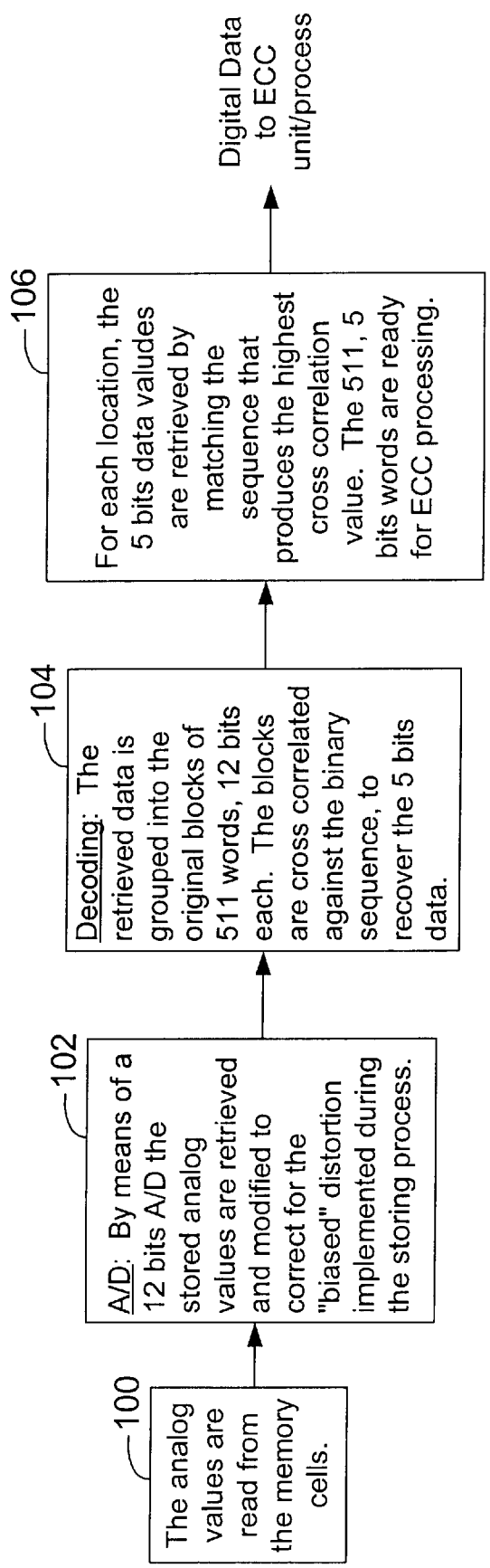
FIG. 8 shows a 5 bit storage read example according to the present invention.

FIG. 8 shows the details of the read process, for the above preferred embodiment of the present invention. At stage 100, the analog values are read from the FLASH memory and, at stage 102, by means of a 12 (preferably more) bits A/D are converted to digital representation. At stage 104, the digital data is then grouped into the 511 words (the original grouping used in the write process). Each block of 511 values is cross correlated against each of the 32 binary PRN sequences used in the writing process (by means of a LUT or computed in real time). At stage 106, for each location in the block the sequence that results the highest value, is matched with the 5 bits data associated with it (as during the write process). The result of the process is, if no errors occur, a block of 511, 5 bits words. Since some errors may occur in the process, the block is transferred to the ECC for further processing: error detection and correction.

Figure 9:
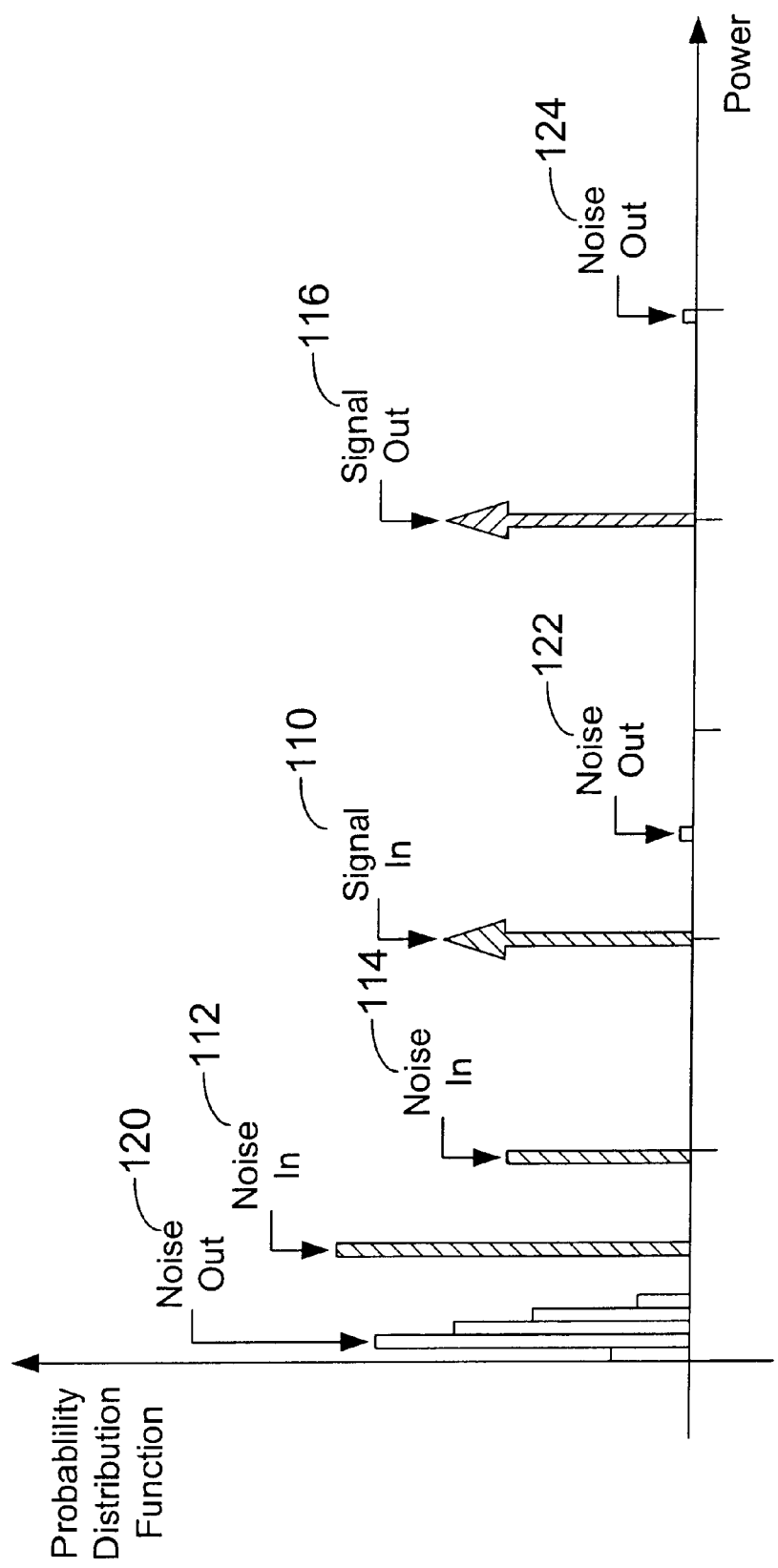
FIG. 9 shows an illustration of processing impact on Storage Noise Vs Signal according to the present invention.

FIG. 9 shows how the processing may impact the noise in ways that reduce the probability of error while improving the relative signal power. The Signal In 110 represents a stored value using the conventional quantized levels approach. The Noise In 112, 114 represents uncertainties in the stored values as potential changes in the values read, in the specific example, half and quarter of the minimum quantization levels, respectively. This allows for recovery of data only if it is really slightly larger then the Signal In 110 (distinguishing clearly between the various data levels). Since the processing results in coherent processing of the stored signal—for example, coding before storage and then decoding for the reading process—the data power is "improved" (Signal Out 116) while the Noise Out power 120, 122, 124 distribution is modified to allow some very high values but with very low probability of occurrence, thus allowing data recovery by means of ECC with high (fully controlled in a specific embodiment) probability and guarantee a very low error rate. By concentrating the Noise Out 120 in the range close to zero, the quantization levels of the signal before the storage process may be decreased so the values stored may be denser.

Figure 10:
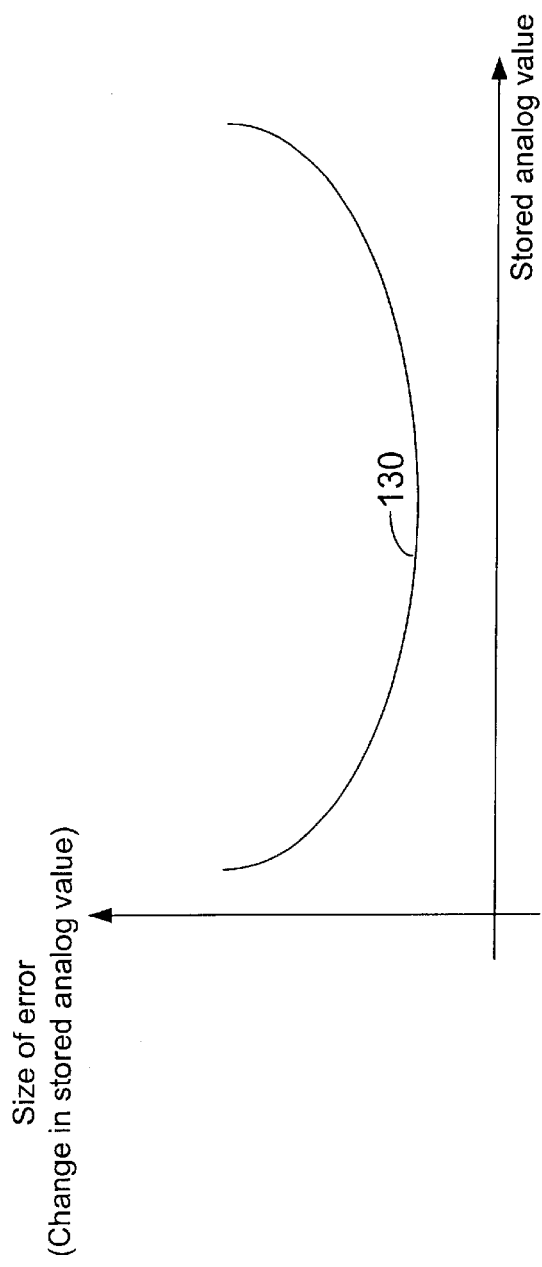
FIG. 10 shows error of retrieved value as a function of stored value according to the present invention.

FIG. 10 shows an example of storage retention capability, defined here as dependency of size of error as function of stored values. It should be emphasized that the use of FIG. 10 is illustrative only. For each specific memory technology, the relation of size of error (change in stored value) as function of analog value stored in the memory cell—where parameters of time, temperature/environment, uses and other—might have an impact on the graph. FIG. 10 demonstrates a case in which the extreme values stored in the memory have higher sensitivity and as result the size of error when reading them is higher. As the stored value 130 approaches the "center" value, the size of error is reduced.

Figure 11:
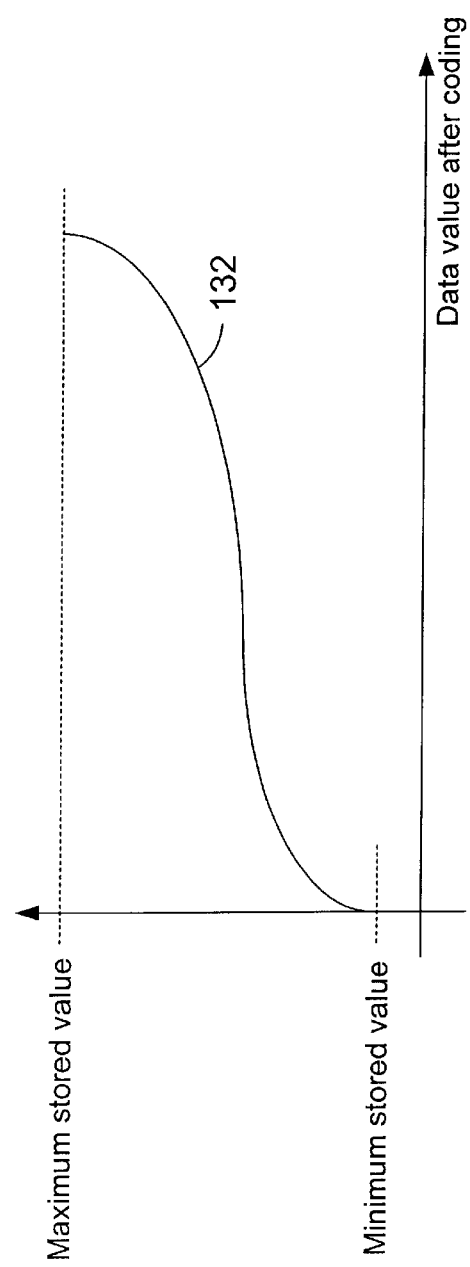
FIG. 11 shows modifying the stored data to accommodate for data loss (Retention mechanism) according to the present invention.

FIG. 11 shows a modification to the data to compensate for the non-uniform error distribution induced on the stored data in the memory. This modification is carried out after the coding, just before the actual storage/writing to the memory. The modification will be carried out to assure for adjacent data values 132 similar probability for error. This will be implemented by taking into account, for the specific example of FIG. 10, the values in a manner assuming the closer the value to the center the lower the error. The actual probability for an error will be impact by two main factor: the error size and the error rate. For different cases the appropriate matching graph will be needed.

FIG. 12 shows a memory organization allowing for mostly efficient implementation by combining various techniques for storage. Organizing the memory in more then one sections to allow the use of a low error probability sections combined with high capacity sections. In FIG. 12, two sections were set: the error immune section 140 for such data as—headers, programs, LUT, parameters and the high capacity area 142 to store compressed images or voice. The application will determined how to use the various memory sections and they will be dynamically allocated and may be even modified based on processing results to accommodate the need for cope with changes in the error rate due to, for example, over use of certain areas of the memory (silicon) or reuse of memory with different content. Thus, not only the use of different quality memory is suggested, but also dynamic reorganization of the memory.

By implementing the cross-correlation prior to the actual storage, knowledge is gained about the potential noise contribution of the process. For each data point, results of the cross-correlation with the other PRN sequences are obtained. The larger the correlation with the right sequence, for a specific data point, the better.

The data point that result in their location higher values for the cross-correlation with the unmatched sequences are more susceptible to noise/error. By reviewing the results of the cross-correlation and the decoding prior to the actual storage will provide information with regard to:

Scaling

Selection of # of bits

ECC technique (potential for error)

Modification of data to reduce error probability

Select an optimal set of PRN sequence

Modify process and storage technique

A header can be used to communicate the needed information for the retrieval process.

Two sets of sequences are used for coding in certain cases: One for the LSBs (Least Significant bits) and the other for the MSBs (Most Significant Bits). The LSB set will be simpler and might be more sensitive to noise.

The decoding process may be carried out in certain order with the PRN sequences, to minimize error probability. After decoding a certain data point, the sequence is subtracted and the new block is processed, with less noise.

As has been described above, the present invention provides several important advantages and features:

1. Coding of the digital data prior to the storage in discrete analog media to improve system total signal to noise ratio.
2. Exact measurement of processing noise prior to actual storage of the data.
3. Optimization of ECC to the exact processing noise.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A storage memory for storing digital data comprising:
   digital signal processing (DSP) means for transforming a digital data bit stream having a stored data component wherein the digital data bit stream is organized into blocks of data having n words in each block with m bits in each word and wherein transformed bit stream is formed into new blocks of n' words in each new block with m' bits in each new word so as to provide improved storage capacity;
   means for converting the transformed digital data to form analog data; and
   discrete analog memory means for storing the analog data.

2. A storage memory for storing digital data, comprising:
   digital signal processing means for transforming a digital data bit stream having a stored data component into a transformed bit stream, the digital data bit stream being organized into blocks of data having n words in each block with m bits in each word, the transformed bit stream being formed into new blocks of n' words in each new block with m' bits in each new word so as to provide improved storage capacity, wherein n' and m' are greater than n and m, respectively;
   means for converting the transformed digital data into analog data, the analog data being representative of the transformed bit stream; and
   discrete analog memory means for storing the analog data.

3. A storage memory as in claim 2 further including error correction process (ECC) means for forming ECC coded digital data corresponding an original digital bit stream prior to a data transformation.

4. A storage memory as in claim 3 including
   means for reading the analog data;
   means for converting the analog data to form digitized analog data; and
   means for restoring the digitized analog data to the original digital bit stream.

5. A storage memory as in claim 4 including
   DSP means for recovering the stored data.

6. A storage memory as in claim 5 including:
   means for grouping the ECC coded digital data into blocks of n words of m bits each;
   means for converting the blocks of words formed by grouping the ECC coded digital data into new blocks of n' words of m' bits each; and
   means for converting the ECC coded digital data to form the analog data to be stored in the discrete analog memory means.

7. A storage memory as in claim 6 including:
   means for reading the stored analog data;
   means for converting the read analog data to form digital data;
   means for grouping the digital data into n' words of m" bits;
   means for grouping the digital data of n' words of m" bits to form n words of m bits; and
   means for recovering the original digital bit stream from the block of n words.

8. A storage memory as in claim 7 including means for mapping the digital data of n' words and m' bits to be stored as a function of the stored analog data.

9. A storage memory as in claim 8 wherein the digital data stored as the function of the stored analog data is a nonlinear function of the ECC coded digital data.

10. A storage memory as in claim 9 wherein the discrete analog memory means includes a low error rate area and a high capacity storage region area.

11. In a storage memory for storing digital data, the method comprising the steps of:
   transforming a digital data bit stream having a stored data component wherein the digital data bit stream is organized into blocks of data having n words in each block with m bits in each word and wherein transformed bit stream is formed into new blocks of n' words in each new block with m' bits in each new word so as to provide improved storage capacity;
   converting the transformed digital data to form analog data; and
   storing the analog data.

* * * * *